United States Patent
Chen

(10) Patent No.: US 6,194,284 B1
(45) Date of Patent: Feb. 27, 2001

(54) METHOD FOR FORMING RESIDUE FREE ETCHED SILICON LAYER

(75) Inventor: Chao-Cheng Chen, Tainan County (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/385,522

(22) Filed: Aug. 30, 1999

(51) Int. Cl.[7] .................................................. H01L 21/76
(52) U.S. Cl. ............................................. 438/424; 438/704
(58) Field of Search ........................... 438/704, 424–438, 438/714, 728, 732, 964

(56) References Cited

U.S. PATENT DOCUMENTS

| | | | |
|---|---|---|---|
| 4,729,815 | 3/1988 | Leung | 156/643 |
| 5,674,775 | 10/1997 | Ho et al. | 437/67 |
| 5,753,561 | 5/1998 | Lee et al. | 438/424 |
| 5,801,083 | 9/1998 | Yu et al. | 438/424 |
| 5,891,807 * | 4/1999 | Muller et al. | 438/713 |

* cited by examiner

*Primary Examiner*—Richard Booth
(74) *Attorney, Agent, or Firm*—George O. Saile; Stephen B. Ackerman

(57) ABSTRACT

A method for forming within a semiconductor substrate layer employed within a semiconductor microelectronics fabrication a shallow trench structure with improved surface properties. There is provided a silicon semiconductor substrate layer. There is then formed over the substrate a patterned photoresist etch mask layer containing the trench pattern. There may be an optional layer formed intermediate between the substrate layer and the patterned photoeresist etch mask layer comprising a pad oxide sub-layer and a silicon nitride etch stop sub-layer. There is then etched the trench pattern employing the photoresist etch mask layer into the substrate layer with a first anisotropic subtractive etching environment. There is then further etched the anisotropically etched trench pattern with a second isotropic subtractive etching environment to form the isotropically etched trench with smooth surfaces. There is then stripped the photoresist etch mask layer and process residues to form a shallow trench structure with attenuated defects and asperities.

18 Claims, 2 Drawing Sheets

METHOD FOR FORMING RESIDUE FREE ETCHED SILICON LAYER

BACKGROUND OF THE INVENTION

1. Field of the Invention

The invention relates to the field of microelectronics fabrication. More particularly, the invention relates to the fabrication of trenches in silicon substrates employed within microelectronics fabrications.

2. Description of the Related Art

Semiconductor microelectronics fabrications are formed from semiconductor substrates within and upon whose surfaces are formed semiconductor microelectronics devices. The semiconductor microelectronics devices are connected internally and externally to the semiconductor substrates upon which they are formed through use of patterned conductor layers which are separated by dielectric layers.

As semiconductor microelectronics fabrication integration levels have increased and semiconductor microelectronics device and patterned layer dimensions have decreased, it has become more prevalent in the art of semiconductor microelectronics fabrication to employ isolation methods, such as but not limited to shallow trench isolation (STI) methods and recessed oxide isolation (ROI) methods, to form patterned planarized trench isolation regions within isolation trenches within semiconductor substrates in order to separate active regions of the semiconductor substrates within and upon which are formed semiconductor microelectronics devices.

Such shallow trench isolation (STI) methods are desirable for forming patterned planarized trench isolation regions within isolation trenches within semiconductor substrates employed within semiconductor microelectronics fabrications, since shallow trench isolation (STI) methods typically provide patterned planarized trench isolation regions which are nominally coplanar with the surfaces of adjoining active regions of a semiconductor substrate which they separate. Such nominally co-planar patterned planarized trench isolation regions and adjoining active regions of a semiconductor substrate generally accommodate employing a limited depth of focus of an advanced photoexposure apparatus employed when forming advanced semiconductor microelectronics devices and patterned conductor layers within an advanced semiconductor microelectronics fabrication.

Of the methods which may be employed for forming patterned planarized shallow trench isolation (STI) regions within semiconductor substrates employed within semiconductor microelectronics fabrications, high density plasma chemical vapor deposition (HDP-CVD) methods employed to fill trenches with dielectric material in conjunction with chemical mechanical polish (CMP) planarization methods have recently received considerable attention. In high density plasma chemical vapor deposition (HDP-CVD) methods, simultaneous chemical vapor deposition (CVD) and inert gas sputtering removal rates are precisely controlled to bring about a net rate of deposition of a layer of silicon oxide dielectric material with desirable properties such as planarity, gap filling, etc. within an isolation trench after its formation within the semiconductor substrate.

While high density plasma chemical vapor deposition (HDP-CVD) methods for trench filling undertaken in conjunction with subsequent chemical mechanical polish (CMP) planarizing methods are thus desirable within the art of semiconductor microelectronics fabrication for forming patterned planarized shallow trench isolation (STI) regions within isolation trenches within semiconductor substrates employed within semiconductor microelectronics fabrications, patterned planarized trench isolation regions so formed and employed are often not entirely without problems. In particular, the formation of the shallow isolation trench itself before filling and planarization can produce difficulties due to the method of selective etching employed to fabricate the trench, especially when the semiconductor substrate employed is a silicon semiconductor substrate as is commonly the case.

In order to form an isolation trench in the semiconductor substrate employed within a semiconductor microelectronics fabrication, an etch resistant layer such as a patterned photoresist etch mask layer is employed, often in conjunction with other etch stop layers, through which is etched the trench pattern by anisotropic subtractive etching of the silicon semiconductor substrate to form the shallow isolation trench. During the etching reactions, it is desirable to form trenches which are free of residues and which have smooth surfaces.

Various methods have ben disclosed for forming shallow isolation trenches within semiconductor substrates employed within microelectronics fabrication.

For example, Leung, in U.S. Pat. No. 4,729,815, discloses a method for forming a vertical walled trench within a semiconductor substrate with rounded top corners and rounded bottom corners. The method employs a three step etching process with $CHF_3$ and, in part, $NF_3$ etching gases and a DC bias voltage which is adjusted differently for each of the three steps to provide the vertical walls and the rounded top and rounded bottom corners.

Further, HO et al., in U.S. Pat. No. 5,674,775, disclose a method for forming a trench in a semiconductor substrate with rounded top corners. The method employs a silicon etch buffer layer formed over a silicon substrate and an anisotropic etch to form first a rounded sidewall spacer layer from the buffer layer, and then as etching continues a trench within the silicon substrate with rounded upper corners. The anisotropic etching is performed with $Cl_2$ and HBr etching gases.

Yet further, Lee et al., in U.S. Pat. No. 5,735,561, disclose a method for forming a shallow trench in a semiconductor substrate with a curved profile. The method employs silicon spacers, temporarily formed on the sides of the trench etching pattern, with rounded profiles formed by anisotropic etching. As the temporary spacer layers are etched away, the curved profile is transferred to the mouth of the trench being etched into the semiconductor substrate. As in the previously cited patent, the etching gases may be $Cl_2$ and HBr.

Finally, Yu et al., in U.S. Pat. No. 5,801,083, disclose a method for forming a shallow isolation trench in a silicon substrate with rounded corners. The method employs a polymer coating formed upon the trench opening as a temporary mask to permit formation of the trench followed by thermal oxidation of the silicon to convert the corners to a rounded profile.

Desirable in the art of microelectronics fabrication are additional methods for forming within semiconductor substrates shallow trenches with smooth residue free surfaces to reduce defects and asperities which can lead to further problems in fabrication.

It is towards this goal that the present invention is generally and specifically directed.

SUMMARY OF THE INVENTION

A first object of the present invention is to provide a method for forming within a silicon semiconductor substrate layer employed within a microelectronics fabrication a shallow trench with improved surface properties.

A second object oft he present invention is to provide a method in accord with the first object of the present invention, where there is formed within a silicon semiconductor substrate by etching a shallow isolation trench with reduced silicon asperities and bumps.

A third object of the present invention is to provide a method in accord with the first object of the present invention and the second object of the present invention, where the method is readily commercially implemented.

In accordance with the objects of the present invention, there is provided a method for forming within a silicon semiconductor substrate layer employed within a microelectronics fabrication an isolation trench with improved surface properties. To practice the method of the present invention, there is first provided a silicon semiconductor substrate layer. Thee is then formed over the silicon substrate layer a patterned photoresist etch mask layer containing a trench pattern. An optional etch stop layer may be formed between the silicon substrate layer and the patterned photoresist etch mask layer. There is then etched the pattern of the isolation trenches employing the patterned photoresist etch mask layer and a first anisotropic subtractive etch environment into the semiconductor substrate, forming an anisotropically etched trench pattern with surface bumps and asperities. There is then further etched the semiconductor substrate in an isotropic etch environment in a magnetic field to form an isotropically etched shallow isolation trench with smooth surfaces with greatly diminished surface asperities. There is then stripped the photoresist etch mask layer and other process residues to form the trench structure with reduced defects and asperities.

The present invention provides a method for forming within a silicon semiconductor substrate employed within a microelectronics fabrication an etched trench pattern with smooth residue fee surfaces having reduced defects and asperities.

The present invention employs methods and materials which are known in the field of integrated circuit microelectronics fabrication, but in a novel sequence and arrangement to achieve the objects. Therefore the method of the present invention is readily commercially implemented.

BRIEF DESCRIPTION OF THE DRAWINGS

The objects, features and advantages of the present invention are understood within the context of the Description of the Preferred Embodiments as set forth below. The Description of the Preferred Embodiments is understood within the context of the accompanying drawings, which form a material part of this disclosure, wherein:

FIG. 1 to FIG. 4 illustrate the formation within a silicon semiconductor substrate layer employed within a microelectronics fabrication of a shallow trench structure with improved surface properties.

FIG. 5 to FIG. 8 illustrate the formation within a silicon semiconductor substrate employed within an integrated circuit microelectronics fabrication of an etched shallow isolation trench structure with improved surface properties and freedom from residues and asperities.

DESCRIPTION OF THE PREFERRED EMBODIMENTS

The present invention provides a method for forming within a semiconductor substrate layer employed within a microelectronics fabrication a shallow trench structure with reduced surface bumps and asperities.

First Preferred Embodiment

Figure 1:
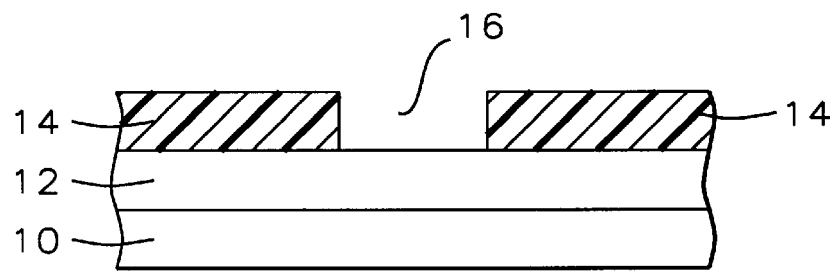
FIG. 1, FIG. 2, FIG. 3 and FIG. 4 are directed to a general embodiment of the present invention which represents a first preferred embodiment of the present invention.

Referring now more particularly to FIG. 1 to FIG. 4, there is shown a series of schematic cross-sectional diagrams illustrating the results of forming within a semiconductor substrate layer employed within a semiconductor microelectronics fabrication in accord with the present invention a shallow trench with improved surface features. FIG. 1 is a schematic cross-sectional diagram of a semiconductor microelectronics fabrication at an early stage in its fabrication in accord with the first preferred embodiment of the present invention.

Shown in FIG. 1 is a substrate 10 having formed over it a semiconductor substrate layer 12. Formed over the semiconductor substrate layer 12 is a patterned photoresist etch mask layer 14 containing the trench pattern 16.

With respect to the substrate 10 shown in FIG. 1, the substrate 10 may be the substrate itself employed within a microelectronics fabrication, or alternatively the substrate 10 may be nay of several microelectronics layers formed upon a substrate employed within a microelectronics fabrication including but not limited to integrated circuit microelectronics fabrications, charge coupled device microelectronics fabrications, solar cell microelectronics fabrications, ceramic substrate microelectronics fabrications and flat panel display microelectronics fabrications.

With respect to the semiconductor substrate layer 12 shown in FIG. 1, the semiconductor layer 12 is a silicon semiconductor layer formed employing methods known in the art of microelectronics fabrication. Preferably the silicon semiconductor layer 12 is formed employing the method of chemical vapor deposition (CVD) employing materials and methods which are known in the art of microelectronics fabrication.

With respect to the patterned photoresist etch mask layer 14 shown in FIG. 1, the patterned photoresist etch mask layer 14 is formed in the pattern of the shallow trench 16 to be formed in the semiconductor substrate layer 12. The phtotresist etch mask layer 14 is formed employing methods and materials known in the art of photolithography employed in microelectronics fabrication.

Figure 2:
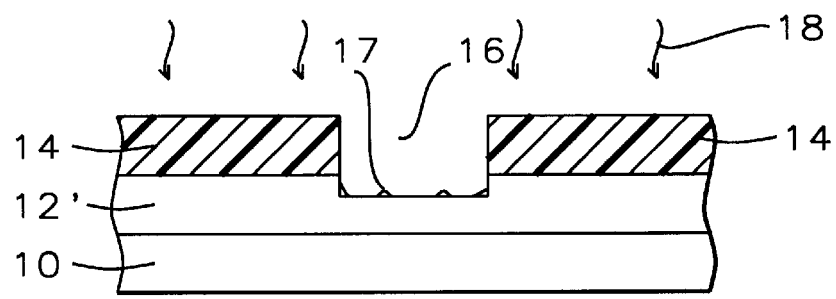

Referring now ore particularly to FIG. 2, there is shown a schematic cross-sectional diagram illustrating the results of further processing of the semiconductor integrated circuit microelectronics fabrication whose schematic cross-sectional diagram is shown in FIG. 1 in accord with the first preferred embodiment of the present invention. Shown in FIG. 2 is a semiconductor integrated circuit microelectronics fabrication otherwise equivalent to the semiconductor integrated circuit microcelectronics fabrication shown in FIG. 1, but where there has been etched anisotropically the shallow trench pattern 16 with residues and asperities 17 through the patterned photoresist etch mask layer 14 into the silicon substrate layer 12 employing a first anisotropic subtractive etching environment 18.

With respect to the first subtractive anisotropic etching environment 18 shown in FIG. 2, the first anisotropic subtractive etching environment 18 employs $Cl_2$, $CF_4$, HBr, $O_2$ and He gases in accord with the following process: (1)

gas flow rates in standard cubic centimeters per minute (sccm): $Cl_2$ from zero to about 50, $CF_4$ from zero to about 50, HBr from about 50 to about 150, $O_2$ from zero to about 10, and He from about 50 to about 150 sccm; (2) power from about 300 to about 1000 watts; (3) pressure from about 30 to about 120 millitorr; and (4) magnetic field from zero to about 50 gauss.

Figure 3:
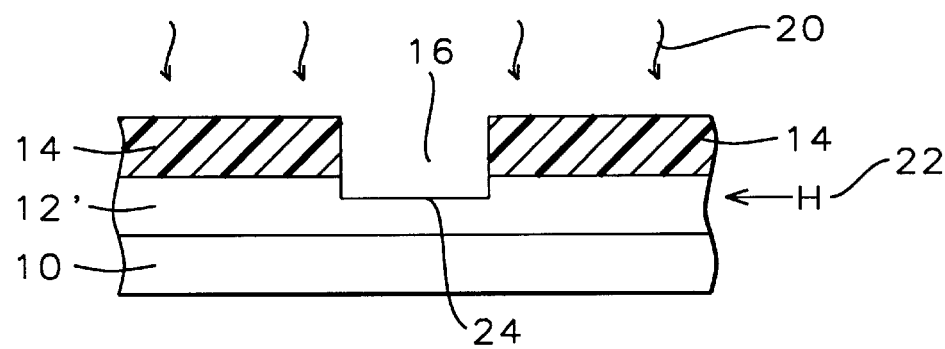

Referring now more particularly to FIG. 3, there is shown a schematic cross-sectional diagram illustrating the results of further processing of the integrated circuit microelectronics fabrication whose schematic cross-sectional diagram is shown in FIG. 2 in accord with the first preferred embodiment of the present invention. Shown in FIG. 3 is an integrated circuit microelectronics fabrication otherwise equivalent to the integrated circuit microelectronics fabrication shown in FIG. 2, but where there has been further etched the shallow trench 16 into the semiconductor substrate layer 12' employing a second plasma isotropic etching environment 20 in a magnetic field 22 to produce an isotropically etched trench with a greatly diminished number of surface asperities on the smooth trench surface 24.

With respect to the second plasma isotropic etching environment 20 shown in FIG. 3, the second isotropic etching environment 20 employs $Cl_2$ in helium carrier gas. Preferably the second plasma isotropic etching method employs the following process: (1) $Cl_2$ gas flow rate form about 50 to about 200 standard cubic centimeters per minute (sccm); (2) helium gas flow rate form about 100 to about 200 standard cubic centimeters per minute (sccm); (3) pressure from about 100 to about 200 mTorr; (4) power from about 100 to about 200 watts; (5) frequency 13.56 mHz; (6) temperature form about 15 to about 50 degrees centigrade; and (7) time about 10 seconds.

With respect to the magnetic field 22 shown in FIG. 3, the magnetic field 22 is formed preferably employing a permanent magnet or alternatively an electronmagnet. Preferably the magnetic field intensity is form about 50 to about 100 gauss.

Figure 4:
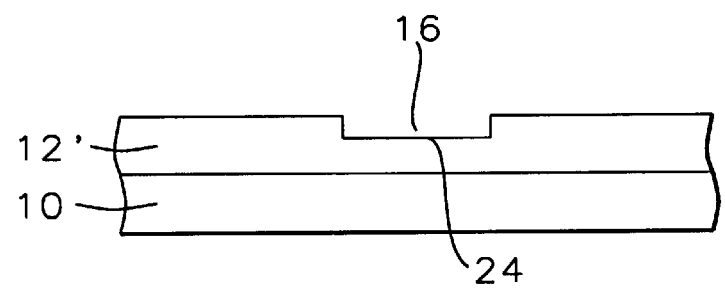

Referring now more particularly to FIG. 4, there is shown a schematic cross-sectional diagram illustrating the results of further processing of the integrated circuit microelectronics fabrication whose schematic cross-sectional diagram is shown in FIG. 3 in accord with the first preferred embodiment of the present invention. Shown in FIG. 4 is integrated circuit microelectronics fabrication otherwise equivalent to the integrated circuit microelectronics fabrication shown in FIG. 3, but where there has been stripped the photoresist etch mask layer and process residues from the trench pattern 16 within the substrate, resulting in a shallow trench structure with smooth surfaces 24 with reduced defects and surface asperities.

With respect to the stripping process shown in FIG. 4, the stripping process employs wet chemical immersion in Caro's acid, which is known in the art of microelectronics fabrication. Preferably the stripping and cleaning sequence is: (1) oxygen ashing; (2) Caro's acid immersion; (3) hydrofluroic (HF) acid immersion.

The shallow trench structure with smooth surfaces and reduced surface asperities provides improved performance with respect to the subsequent forming of shallow trench isolation structures. In particular, after filing of the shallow trenches with dielectric isolation material, it is common practice to planarize the resulting substrate surface by chemical mechanical polish (CMP) planarization methods, where the greatly diminished number of surface asperities significantly reduces the likelihood of scratching during the polishing step.

Second Preferred Embodiment

Figure 5:
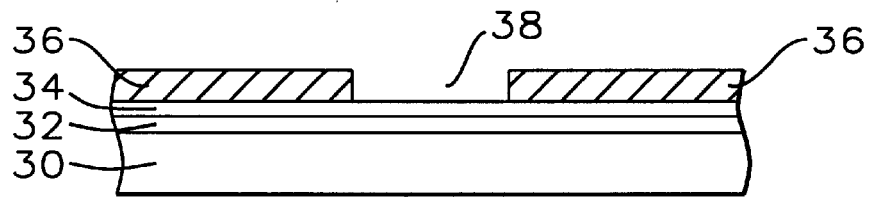
FIG. 5, FIG. 6, FIG. 7 and FIG. 8 are directed towards a more specific embodiment of the present invention which constitutes a second preferred embodiment of the present invention.

Referring now more particularly to FIG. 5 to FIG. 8, there is shown a series of schematic cross-sectional diagrams illustrating the results of forming within a silicon semiconductor substrate employed within an integrated circuit microelectronics fabrication in accord wit ha more specific embodiment of the present invention which constitutes a second preferred embodiment of the present invention an etched shallow isolation trench structure with smooth surfaces free of residues having reduced defects and asperities. FIG. 5 is a schematic cross-sectional diagram of a silicon semiconductor integrated circuit microelectronics fabrication at an early stage in its fabrication in accord with the second preferred embodiment of the present invention.

Shown in FIG. 5 is a silicon semiconductor substrate 30 upon which is formed a pad oxide layer 32 and a silicon oxide etch stop layer 34. Formed over the substrate 30 is a patterned photoresist etch mask layer 36 having formed within it a shallow isolation trench pattern 38.

With respect to the silicon semiconductor substrate 30 shown in FIG. 5, the silicon semiconductor substrate 30 is analogous to the silicon semiconductor substrate layer 12 shown in FIG. 1 of the first preferred embodiment of the present invention.

With respect to the pad oxide layer 32 shown in FIG. 5, the pad oxide layer 32 is a silicon oxide dielectric layer formed employing low pressure chemical vapor deposition (LPCVD) method, which is known in the art of microelectronics fabrication.

With respect to the silicon nitride etch stop layer 34 shown in FIG. 5, the silicon nitride etch stop layer 34 is formed employing low pressure chemical vapor deposition (LPCVD) methods which are known in the art of microelectonics fabrication.

With respect to the photoresist etch mask layer 36 shown in FIG. 5, the photoresist etch mask layer 36 is equivalent or analogous to the photoresist etch mask layer 14 shown in FIG. 1 of the first preferred embodiment of the present invention.

Figure 6:
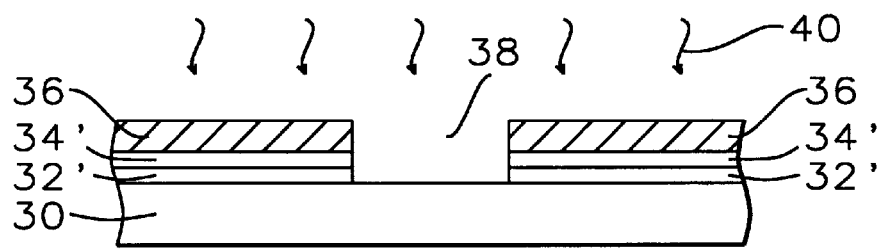

Referring now to FIG. 6, there is shown a schematic cross-sectional diagram illustrating the results of further processing of the integrated circuit microelectronics fabrication whose schematic cross-sectional diagram is shown in FIG. 5 in accord with the second preferred embodiment of the present invention. Shown in FIG. 6 is an integrated circuit microelectronics fabrication otherwise equivalent to the integrated circuit microelectronics fabrication shown in FIG. 5, but where there has been etched through the photoresist etch mask layer 36 the shallow isolation trench pattern 38 into the silicon nitride etch stop layer 34' and the pad oxide layer 32' employing a first anistropic subtractive etching environment 40.

With respect to the first anisotropic subtractive etching environment 40 shown in FIG. 6, the first anisotropic subtractive etching environment employs $CHF_3$, $CF_4$, $O_2$ and argon gases in accord with the following process: (1) Gas flow rates in standard cubic centimeters per minute (sccm); $CHF_3$ from about 10 to about 50, $O_2$ from zero to about 50, and argon from about 50 to about 200 sccm; (2) power form about 400 to about 1000 watts; (3) pressure from about 30 to about 100 millitorr; and (4) magnetic field from zero to about 50 gauss.

Figure 7:
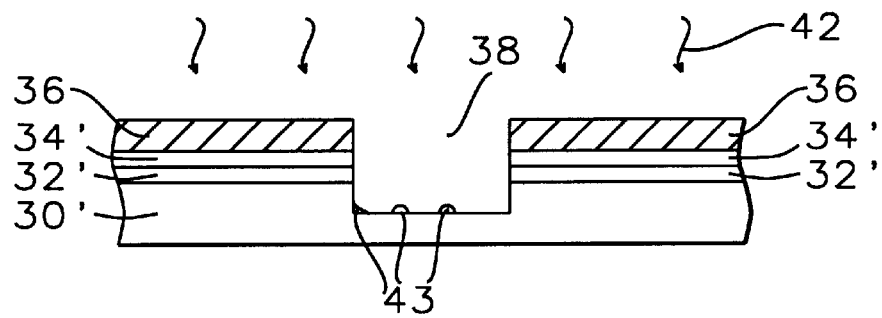

Referring now more particularly to FIG. 7, there is shown a schematic cross-sectional diagram illustrating the results of further processing of the integrated circuit microelectronics fabrication whose schematic cross-sectional diagram was shown in FIG. 6 in accord with the second preferred embodiment of the resent invention. Shown in FIG. 7 is an integrated circuit microelectronics fabrication otherwise equivalent to the integrated circuit microelectronics fabrication shown in FIG. 6, but where there has been further etched the trench pattern 38 into the substrate employing a second anisotropic etching environment 42, forming an anisotropically etched trench pattern with surface asperities and residues 43.

With respect to the second anisotropic subtractive etching environment 42 shown in FIG. 7, the second anisotropic etching environment 42 is equivalent to or analogous to the first anisotropic etching environment shown in FIG. 2 of the first preferred embodiment of the present invention.

Figure 8:
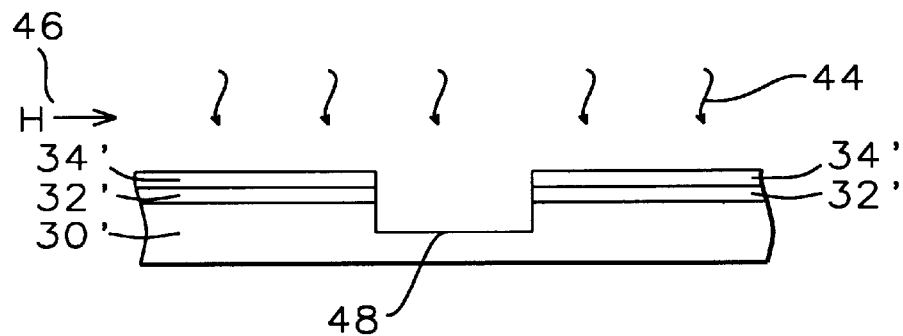

Referring now more particularly to FIG. 8, there is shown a schematic cross-sectional diagram illustrating the final results of processing of the integrated circuit microelectronics fabrication whose schematic cross-sectional diagram is shown in FIG. 7 in accord with the second preferred embodiment of the present invention. Shown in FIG. 8 is an integrated circuit microelectronics fabrication otherwise equivalent to the integrated circuit microelectronics fabrication shown in FIG. 7, but where there has been etched into the substrate anisotropically etched trench pattern 38 with smooth surfaces 48 having greatly diminished residues and asperities, employing a plasma isotropic etching environment 44 in the presence of a magnetic field 46. Upon completion of isotropic etching, the photoresist mask layer 36 and process residues are stripped employing wet chemical methods an materials such as Caro's acid which are known in the art of microelectronics fabrication.

With respect to the plasma isotropic etching environment 44 shown in FIG. 8, the isotropic etching environment 44 is equivalent or analogous to the plasma isotropic etching environment shown in FIG. 3 of the first preferred embodiment of the present invention.

With respect to the magnetic field 46 shown in FIG. 8, the magnetic field is equivalent or analogous to the magnetic field shown in FIG. 3 of the first preferred embodiment of the present invention.

The reduction of surface asperities and defects within the shallow isolation trench structure minimizes the formation of bridges between active areas of the semiconductor substrate separated by the shallow trench isolation (STI) structures. In addition, the reduction of asperities within the shallow trench reduces the chances of subsequent scratching of the substrate surface after filling of the trench and chemical mechanical polish (CMP) planarization of the integrated circuit microelectronics fabrication.

Experimental Results

The benefits and advantages of the preferred embodiments of the present invention are exemplified by the following experimental results. Control samples were prepared in accord with the standard method employing silicon substrate wafers of 200 millimeter diameter which were subjected to: (1) shallow trench isolation (STI) etching with HBr and $O_2$He gases; (2) PSC $O_2$ ashing; (3) stripping with Caro's acid; (4) hydrofluoric (HF) acid dipping; and (5) B clean. Experimental samples wee prepared in the same manner with the addition of a step (2)a wherein there was exposed the silicon substrates to an plasma isotropic subtractive etching environment in a magnetic field in accord with the method of the present invention. All samples were scanned with a KLA surface scanner to measure the number of particulates, asperities, and other detectable defects within the area of a chip die. The results are shown in Table I:

TABLE I

| Particulate Counts With KLA Scanner | |
|---|---|
| Control, counts/die area | Experimental, counts/die area |
| 235 | 44 |
| 5000 | 1346 |

It is evident that the method of the present invention results in a greatly diminished number of detectable defects as measured with surface scanning techniques.

As is understood by a person skilled in the art, the preferred embodiment of the present invention is illustrative of the resent invention rather than limiting of the present invention. Revisions and modifications may be made to materials, methods, structures and dimensions through which are formed integrated circuit microelectronics fabrications in accord with the preferred embodiment of the resent invention without departing from the spirit and scope of the present invention as defined by the appended claims.

What is claimed is:

1. A method for forming a trench within a silicon substrate layer comprising:

providing a substrate;

forming upon the substrate a silicon layer;

forming over the silicon layer a masking layer;

etching, while employing a first subtractive etching method an anisotropically etched trench within the silicon layer, the anisotropically etched trench having surface asperities formed therein;

etching, while employing a second isotropic plasma etching environment in a magnetic field, the anisotropically etched trench further to form an isotropically etched trench having the surface asperities therein greatly diminished.

2. The method of claim 1 further comprising:

chemically stripping a photoresist etch mask layer and polymer residues from the semiconductor substrate and cleaning the semiconductor substrate to form a shallow trench structure within the substrate with smooth surfaces and attenuated defects and asperities.

3. The method of claim 1 wherein the substrate is employed within a microelectronics fabrication selected from the group consisting of:

integrated circuit microelectronics fabrications;

charge coupled device microelectronics fabrications;

solar cell microelectronics fabrications;

ceramic substrate microelectronics fabrications; and flat panel display microelectronics fabrications.

4. The method of claim 1 wherein the silicon layer is formed by chemical vapor deposition (CVD).

5. The method of claim 1 wherein the first anistropic subtractive etching environment employs $Cl_2$, HBr, $CF_4$, $O_2$ and helium gases.

6. The method of claim 1 wherein the second plasma isotropic etching environment employs $Cl_2$ and helium gases in a magnetic field of from about 50 to about 100 gauss.

7. The method of claim 1 wherein the magnetic field is supplied by permanent or electromagnets.

8. The method of claim 2 wherein the chemical stripping of the polymer residues is performed employing Caro's acid.

9. A method for forming within a silicon semiconductor substrate employed within an integrated circuit microelectronics fabrication a shallow isolation trench comprising:

provided a silicon semiconductor substrate;

forming over the silicon semiconductor substrate a composite etch stop layer;

forming over the composite etch stop layer a patterned photoresist etch mask layer;

etching, employing first anisotropic etching environment, a trench pattern through the silicon nitride layer and the pad oxide dielectric layer;

etching further, employing a second anisotropic etching environment, the trench pattern anisotropically into the silicon substrate while forming surface asperities therein;

etching still further, employing a plasma isotropic etching environment in the presence of a magnetic field, the trench pattern to form an isotropically etched trench with greatly diminished surface asperities; and stripping the photoresist mask layer and process residues from the substrate to form a trench structure with smooth surfaces and reduced defects and asperities.

10. The method of claim 9 wherein the composite etch stop layer comprises:

a first lower pad oxide sub-layer; and a second upper silicon nitride sub-layer.

11. The method of claim 9 wherein the first anisotropic subtractive etching environment employs $CHF_3$, $CF_4$, $O_2$ and argon gases.

12. The method of claim 9 wherein the second anisotropic subtractive etching environment employs HBr, $Cl_2$, $CF_4$, $O_2$ and argon gases.

13. The method of claim 9 wherein the third plasma isotropic etching environment employs $Cl_2$ and helium gases.

14. The method of claim 9 wherein the magnetic field is applied by permanent magnets or electromagnets to supply a magnetic field of from about 50 to about 100 gauss.

15. The method of claim 10 wherein the first lower pad oxide sub-layer is formed of silicon oxide dielectric material employing low pressure chemical vapor deposition (LPCVD) method.

16. The method of claim 10 wherein the second upper silicon nitride etch stop sub-layer is formed employing low pressure chemical vapor deposition (LPCVD) method.

17. The method of claim 9 wherein the stripping of the photoresist etch mask layer and polymer process residues is accomplished employing Caro's acid.

18. The method of claim 9 wherein the stripping method employs a wet chemical mixture consisting of:

hydrofluroic acid (HF);

hydrogen peroxide ($H_2O_2$; and ammonia ($NH_3$).

* * * * *